(12) United States Patent
Kuwamura et al.

(10) Patent No.: US 10,663,786 B2
(45) Date of Patent: May 26, 2020

(54) LIQUID CRYSTAL DISPLAY DEVICE

(71) Applicant: SHARP KABUSHIKI KAISHA, Sakai, Osaka (JP)

(72) Inventors: Yohji Kuwamura, Sakai (JP); Kohichi Ohhara, Sakai (JP); Takuya Handa, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 16/366,864

(22) Filed: Mar. 27, 2019

(65) Prior Publication Data

US 2019/0302514 A1  Oct. 3, 2019

Related U.S. Application Data

(60) Provisional application No. 62/649,716, filed on Mar. 29, 2018.

(51) Int. Cl.
*G02F 1/133* (2006.01)
*G02F 1/1333* (2006.01)
*G02F 1/1335* (2006.01)
*G02F 1/1339* (2006.01)

(52) U.S. Cl.
CPC .. *G02F 1/133382* (2013.01); *G02F 1/133308* (2013.01); *G02F 1/133528* (2013.01); *G02F 1/1339* (2013.01)

(58) Field of Classification Search
None
See application file for complete search history.

(56) References Cited

U.S. PATENT DOCUMENTS

2008/0309865 A1* 12/2008 Sugita ............... G02F 1/133382
349/150
2017/0090240 A1* 3/2017 Liu ..................... G02F 1/13338

FOREIGN PATENT DOCUMENTS

JP  2013-137480 A  7/2013

* cited by examiner

*Primary Examiner* — James A Dudek
(74) *Attorney, Agent, or Firm* — ScienBiziP, P.C.

(57) ABSTRACT

In a liquid crystal display device including a liquid crystal panel displaying an image and an LED and an IC driver which is a heat generating component generating heat during operation, the liquid crystal panel includes a pair of substrates that are disposed opposite each other, and a liquid crystal layer containing liquid crystal molecules and sealed between the pair of substrates, and a transparent thermal conducing sheet is disposed such that a part thereof is continuous from the LED and the IC driver and another part thereof is directly in contact with a TFT substrate to cover a display area.

9 Claims, 3 Drawing Sheets

LIQUID CRYSTAL DISPLAY DEVICE

CROSS REFERENCE TO RELATED APPLICATION

This application claims priority from U.S. Provisional Application No. 62/649,716 filed on Mar. 29, 2018. The entire contents of the priority application are incorporated herein by reference.

TECHNICAL FIELD

The present technology relates to a liquid crystal display device.

BACKGROUND ART

A liquid crystal display device includes a liquid crystal panel that does not emit light and a backlight unit that includes a light source such as LEDs to illuminate the liquid crystal panel. The LEDs are heat generating components that generate heat during operation. When a part of the liquid crystal display device is heated with the heat generated by the heat generating components, not only lives of the LEDs may be shortened but also a touch panel or a driver may malfunction or display quality may decrease due to degradation of a liquid crystal.

A response speed of the liquid crystal display panel is highly dependent on temperature. At a low temperature, viscosity of the liquid crystal increases and the response speed decreases. This may create afterimages.

For example, Patent Document 1 discloses a liquid crystal display device that includes a liquid crystal panel, a backlight, and a transparent thermal conducting sheet. The backlight includes a light source and a component disposed at least behind the light source but not in front of the light source. The thermal conducting sheet is disposed opposite the liquid crystal panel to cover at least a display area and to contact the component. In the liquid crystal display device, heat generated by the light source is transferred to the liquid crystal panel via the transparent thermal conducting sheet to warm the liquid crystals. Through economical use of the heat, local heatup is less likely to occur and the response speed under low temperature improves.

Patent Document 1: Japanese Unexamined Patent Application Publication No. 2013-137480

Recently, in the liquid crystal display devices, definition has been enhanced to achieve highly realistic feeling and feeling of an actual object in image experience. As the definition of the screen increases, the transmittance of the liquid crystal panel is lowered. Therefore, the number of light sources such as the LEDs required for obtaining sufficient screen brightness increases according to the enhancement of the definition. As the number of the heat generating components increases, the amount of heat generated at the driving of the liquid crystal display device increases and problems are likely to be caused by the heat. Particularly, in a head mounted display (HMD) for VR, which has been highly demanded recently, heat is likely to stay within the device and problems are likely to be caused. Furthermore, in the HMD, images are clearly displayed while being switched at high speed and therefore, liquid crystals having high response speed are demanded. However, the liquid crystal display device described in Patent Document 1 is configured such that the thermal conducting sheet, which is a part of the backlight unit, contacts an outer side of the liquid crystal panel to transfer heat. Therefore, there is limitation for warming the liquid crystals sealed between the pair of substrates of the liquid crystal panel and further improvement has been demanded.

SUMMARY

The technology described herein was made in view of the above circumstances. An object is to effectively use heat generated by heat generating components including a light source through efficient diffusive conduction for warming liquid crystals.

A liquid crystal display device according to the present technology includes a liquid crystal panel displaying an image and one heat generating component or multiple heat generating components that generates/generate heat during operation. The liquid crystal panel includes a pair of substrates that are disposed opposite each other, and a liquid crystal layer containing liquid crystal molecules and being sealed between the pair of substrates. A transparent thermal conducing sheet is disposed such that a part thereof is continuous from the heat generating component and another part thereof is directly in contact with at least one of the pair of substrates to cover a display area.

According to the above configuration, the heat can be efficiently transferred from the heat generating component to the liquid crystal layer via the thermal conducting sheet that is directly in contact with one substrate. Accordingly, the heat generated by the heat generating component can be effectively used to warm the liquid crystal layer without being wasted. Since the thermal conducting sheet is disposed to cover the display area of the one substrate, the heat can be diffused over a large area such that a local heatup of the liquid crystal display device is less likely to occur and lowering of the response speed at a low temperature is less likely to occur. Therefore, the liquid crystal display device that achieved high definition and high response speed while saving energy can be obtained. The phrase of "at least a part of the thermal conducting sheet is continuous from the heat generating component" may include that the thermal conducting sheet is directly continuous from the heat generating component or the thermal conducting sheet is indirectly continuous from the heat generating component via another component.

Advantageous Effect of the Invention

A local heatup of the liquid crystal display device is less likely to occur and lowering of the response speed at a low temperature is less likely to occur. Therefore, the liquid crystal display device that achieved high definition and high response speed while saving energy can be obtained.

DETAILED DESCRIPTION

First Embodiment

A first embodiment will be described with reference to FIGS. 1 and 2.

In this section, a liquid crystal display device 1 will be described. In FIG. 1, the X-axis, the Y-axis, and the Z-axis are present. Axes in other drawings correspond with directions represented by the respective axes in FIG. 1. The upper side and the right side in FIG. 1 correspond with the front side and the upper side of the liquid crystal display device 1, respectively (the lower side and the left side in FIG. 1 correspond with the rear side and the lower side of the liquid crystal display device, respectively). One of multiple components having the same configuration may be indicated by a reference symbol and others may not be indicated by the reference symbol (this may be applied to the drawings according to the second embodiment).

[Liquid crystal display device 1]

Figure 1:
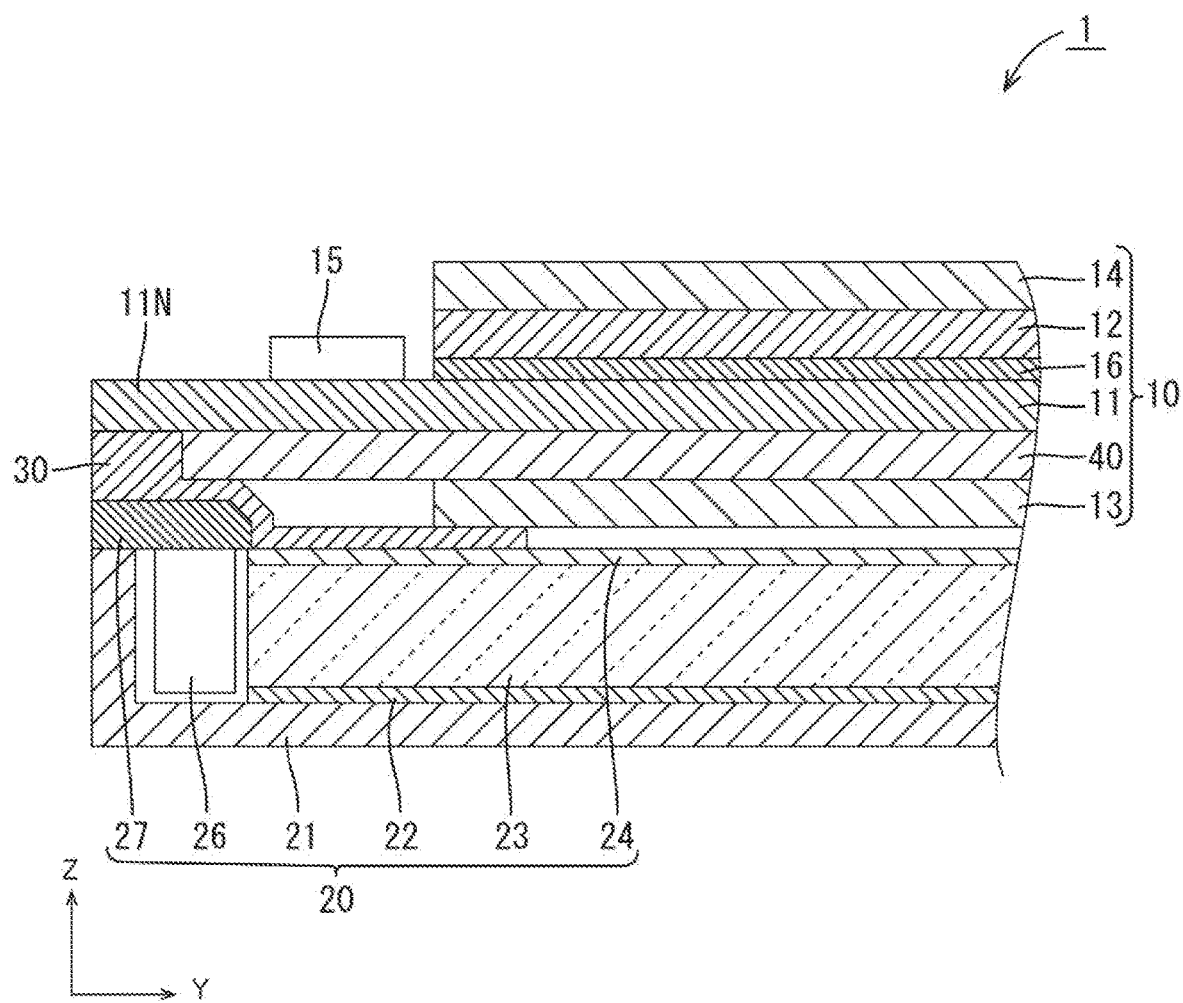
FIG. 1 is a cross-sectional schematic view schematically illustrating a configuration of a liquid crystal display device according to a first embodiment.
Figure 2:
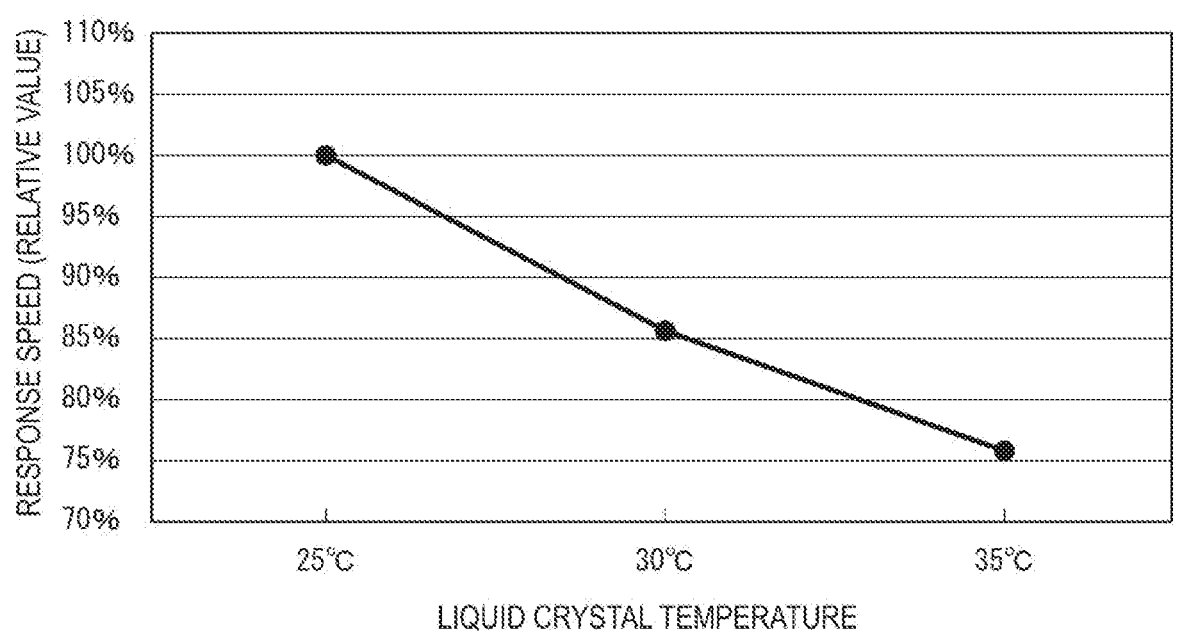
FIG. 2 is a graph illustrating temperature dependency of a response speed.

As illustrated in FIG. 1, the liquid crystal display device 1 according to this embodiment mainly includes a liquid crystal panel 10 and a backlight unit 20. The liquid crystal panel 10 and the backlight unit 20 are fixed together with a liquid crystal panel fixing tape 30 (an example of a liquid crystal panel fixing member). The liquid crystal display device 1 according to this embodiment has a rectangular plate-like overall shape. The liquid crystal display device 1 may be applied to, but not limited to, a head mounted display (HMD) for VR, requires high definition and a high response speed at the same time and within which heat tends to stay. The liquid crystal display device 1 will be described with a short direction, a long direction, and a thickness direction (a front-rear direction) aligned with the X-axis, the Y-axis, and the Z-axis, respectively.

[Liquid Crystal Panel 10]

The liquid crystal panel 10 may have a known configuration and may be a known liquid crystal panel without limitation.

The liquid crystal panel 10 in the first embodiment will not be illustrated in detail. The liquid crystal panel 10 includes two substrates 11 and 12 bonded together with a predefined gap therebetween. A liquid crystal is sealed between the substrates 11 and 12. The substrate 11 disposed on the rear side is a TFT substrate (an array substrate, a pixel electrode substrate) including a transparent substrate, source lines, gate lines, switching components (e.g., TFTs), pixel electrodes, and an alignment film. The source lines and the gate lines are perpendicular to one another. The switching components are connected to the source lines and the gate lines and the pixel electrodes are connected to the switching components on the transparent substrate. The alignment film is disposed on the transparent substrate. The substrate 12 disposed on the front side is a CF substrate 12 (a common substrate) including a transparent substrate, a color filter, a common electrode, and an alignment film. The color filter including red (R), green (G), and blue (B) color portions in predefined arrangement, the common electrode, and the alignment film are disposed on the transparent substrate. The transparent substrates included in the TFT substrate and the CF substrate may be glass substrates made of alkali-free glass or resin substrates made of transparent resin such as polycarbonate resin, cyclic olefin resin, and polyether sulfone resin. It is preferable to use transparent substrates having high thermal conductivity for efficiently transferring heat in a thermal conducting sheet 40, which will be described later, to a liquid crystal layer 16.

The CF substrate 12 has a short dimension (in the X-axis direction) about equal to a short dimension of the TFT substrate 11 and a long dimension (in the Y-axis direction) smaller than a short dimension of the TFT substrate 11. With an upper short side edge (on the right side in FIG. 1) of the TFT substrate 11 aligned with that of the CF substrate 12, the TFT substrate 11 and the CF substrate 12 are bonded together. A side edge including a lower short edge of the TFT substrate 11 (on the left side in FIG. 1) includes a region that does not overlap the CF substrate 12. The region of the TFT substrate 11 not overlapping the CF substrate 12 in a plan view will be referred to as a common substrate non-overlapping region 11N. A display area (an active area, AA) is defined in the middle section of an overlapping region in which the TFT substrate 11 and the CF substrate 12 overlap each other. The entire common substrate non-overlapping region 11N of the TFT substrate 11 is included in a non-display area.

An IC driver 15 is mounted in the common substrate non-overlapping region 11N of the TFT substrate 11 for processing signals for driving the liquid crystal panel 10. The IC driver 15 includes an LSI chip that includes a drive circuit. The driver 15 is configured to receive input signals supplied by a control circuit board that is a signal source and to generate output signals that is output to the display area of the liquid crystal panel 10. When voltages are applied to the pixel electrodes based on the output signals, potential differences are created between the pixel electrodes and the common electrode. As a result, a fringe electric field (an oblique electric field) is applied to the liquid crystal layer 16 sealed between the substrates 11 and 12. The oblique electric field includes a component in a normal direction to the plate surfaces of the substrates 11 and 12. By controlling the electric field, switching of orientations of liquid crystal molecules in the liquid crystal layer 16 can be timely performed and images are displayed in the display area. The IC driver 15 is an example of the heat generating component that generates heat during operation.

As illustrated in FIG. 1, in the liquid crystal panel 10 according to the first embodiment, polarizing plates 13 and 14 are disposed on the foremost and the rearmost. The polarizing plates 13 and 14 are one kind of optical members having a function of selectively passing light that oscillate in a specific direction. One of the polarizing plates 13 and 14 disposed behind the TFT substrate 11 will be referred to as a rear polarizing plate 13. The polarizing plate 14 in front of the CF substrate 12 will be referred to as a front polarizing plate 14.

The light entering the liquid crystal layer 16 via the rear polarizing plate 13 travels through the liquid crystal layer 16 in a rear-front direction (a thickness direction, the Z-axis direction) while altering a polarizing condition according to the orientations of the liquid crystal molecules. Rays of the light which have passed through the front polarizing plate 14 exited are used for display. As described earlier, by altering the orientations of the liquid crystal molecules through control of the electric field applied to the liquid crystal layer 16, light transmissivity of the liquid crystal panel 10 alters and images are displayed on the front surface (an image display surface) of the liquid crystal panel 10.

The polarizing plates 3 and 14 in the first embodiment are prepared by coloring a polyvinyl alcohol polymer with iodine and stretching the polyvinyl alcohol polymer to form the polyvinyl alcohol polymer in a film shape and to align orientations of iodine molecules (polarizing elements). When light is applied to the polarizing plates 13 and 14, light rays in a direction parallel to a direction in which axes of the iodine molecules are oriented are absorbed and only the light rays in a direction perpendicular to the polarizing plates 13 and 14 pass through the polarizing plates 13 and 14. The rear polarizing plate 13 and the front polarizing plate 14 have shapes and dimensions that are about equal to those of the CF substrate 12. The rear polarizing plate 13 and the front polarizing plate 14 are disposed to overlap the CF substrate 12 in a plan view.

In the first embodiment, the transparent thermal conducting sheet 40 is disposed between the TFT substrate 11 and the rear polarizing plate 13 to contact the TFT substrate 11. The thermal conducting sheet 40 has a long dimension in the longitudinal direction (the Y-axis direction) larger than that of the CF substrate 12 or the polarizing plates 13 and 14 but slightly smaller than that of the TFT substrate 11. The thermal conducting sheet 40 is disposed with an upper short edge is aligned with the upper short edge of the TFT substrate 11 to cover the entire display area of the TFT substrate 11 and overlap the common substrate non-overlapping region 11N. The thermal conductive sheet 40 extends over the rear polarizing plate 13 to be exposed behind the common substrate non-overlapping region 11N. Performance and material of the thermal conducting sheet 40 will be described later.

[Backlight Unit 20]

A configuration of the backlight unit 20 will be briefly described. The backlight unit 20 may have, but not limited to, a known configuration.

As illustrated in FIG. 1, in the first embodiment, the LEDs (light emitting diodes) 26 that are light sources are disposed along a side edge of a light guide plate 23 that is disposed inner than the LEDs 26. Namely, the backlight unit 20 is an edge-light type (a sidelight type).

As illustrated in FIG. 1, the backlight unit 20 includes a frame 21 that is a case having an opening on the front side, or a light emitting side (on the liquid crystal panel 10 side) and a predefined thickness. The frame 21 functions as a holder that holds optical members and other components therein. The optical members will be described later. The frame 21 in the first embodiment includes a bottom wall and sidewalls that define a rectangular box shape.

The frame 21 is made of synthetic resin to have insulating properties. The frame 21 may be prepared by injecting molding polycarbonate resin or acrylonitrile butadiene styrene resin (ABS). A color of the frame 21 may be, but not limited to, white for improve light use efficiency or black for reducing leakage of light to the outside.

As illustrated in FIG. 1, a reflection sheet 22 is disposed in front of the bottom wall of the frame 21. The reflection sheet 22 is one kind of the optical sheets having a function of reflecting light rays traveling toward the back surface of the light guide plate 23, which will be described later, toward the front side. With the reflection sheet 22, an amount of light rays traveling toward the liquid crystal panel 10 is increased to increase screen brightness. The reflection sheet 22 is made of synthetic resin to have insulating properties similar to the frame 21. It is preferable that t the reflection sheet 22 has a front surface in white having high light reflectivity.

The light guide plate 23 is disposed in front of the reflection sheet 22 inside the frame 21. The light guide plate 23 is one kind of the optical members having a function of receiving the light emitted by a light source disposed opposite one of end surfaces along the X-axis direction, passing the light therethrough, guiding the light to a side away from the light source and toward the front side, that is, the light exiting side (the liquid crystal panel 10 side), and outputting planar light through the plate surface on the front side. The light guide plate 23 is may of synthetic resin that is substantially transparent (having high light transmissivity) and has a refractive index substantially larger than that of the air (e.g., acrylic resin such as PMMA, polycarbonate resin). The light guide plate 23 in the first embodiment is made of polycarbonate resin.

An optical sheet 24 is disposed on the light guide plate 23 on the front side (the light exiting side) between the liquid crystal panel 10 and the light guide plate 23. The optical sheet disposed in front of the light guide plate 23 has a function of passing the light exiting from the light guide plate 23 and outputting the light with predefined optical effects exerted by the optical sheet toward the liquid crystal panel 10. In FIG. 1, the optical sheet 24 is illustrated as a single component. However, the optical sheet 24 may include multiple optical sheets that exert different optical actions to obtain target functions. The optical sheet 24 may include a diffuser sheet, a rear lens sheet, and a front lens sheet layered in this sequence from the light guide plate 23 side. The diffuser sheet has a function of diffusing light exiting from the light guide plate 23 and entering through the back surface of the diffuser sheet and outputting the light toward the front side (the light emitting side, the liquid crystal panel 10 side) to equalize the amount of light from the light source. The diffuser sheet may include a sheet prepared by forming a polycarbonate resin in a sheet shape and small prisms having refractive surfaces and formed in a continuous manner on a surface of the sheet. The lens sheet adjusts travel directions of the light rays via the diffuser sheet so that the light rays are collected. An example of the lens sheet includes unit lenses that extend in one direction. The unit lenses may be arranged in a direction perpendicular to the direction in which the unit lenses extend on a sheet made of polyester resin.

The LEDs 26 (an example of the light source) mounted on the LED substrate 27 (an example of the light source substrate) are held at positions opposed to the end surface of the light guide plate 23 along the side edge inside the frame 21.

The LEDs 26 are a light source of light rays that are supplied from the backlight unit 20 to the liquid crystal panel 10. Known LEDs of a top surface light emission type or a side surface light emission type may be used as the LEDs. In the first embodiment, the LEDs 26 of the side surface light emission type are used and a side surface that is next to a mounting surface to be mounted on the LED substrate 27 is a light emission surface. Multiple LEDs are aligned along the edge surface of the light guide plate 23 although only one LED 26 is illustrated in FIG. 1. The LEDs 26 are one example of the heat generating components and generates light and heat during operation.

The LED substrate 27 on which the LEDs 26 are mounted controls lighting of the LEDs 26 according to input signals input from an external device.

The LED substrate 27 according to the first embodiment includes a support substrate formed in a plate shape and is disposed such that a plate surface thereof is parallel to plate surfaces of the liquid crystal panel 10 and the light guide plate 23. In the first embodiment, as illustrated in FIG. 1, the LED substrate 27 is disposed to extend from a front surface of the sidewall of the frame 21 to the optical sheet 24 overlapping the front surface of the light guide plate 23. The LEDs 26 are mounted on a back surface of the LED substrate 27 close to the light guide plate 23. Signal wirings for controlling lighting of the LEDs 26 are routed on the LED substrate 27. A part of the signal wirings is connected to a main board, which is connected to electrodes of the liquid crystal panel 10, and supplied with power that is required for lighting of the LEDs 26. Accordingly, lighting on and off of the LEDs 26 is controlled according to the input signal from an external device.

The support substrate of the LED substrate 27 is made of epoxy resin or phenol resin and is preferably made of metal having high thermal conductivity (such as aluminum) to transfer and release heat generated by the LEDs 26 and effectively transfer the heat to a liquid crystal panel fixing tape 30.

[Liquid Crystal Panel Fixing Tape 30]

The liquid crystal panel 10 and the backlight unit 20 that include the above described components are fixed with the liquid crystal panel fixing tape (one example of a liquid crystal panel fixing member) 30. In the first embodiment, the liquid crystal panel fixing tape 30 extends in the X-direction and over an entire length of a short side of the liquid crystal panel 10 where the LEDs 26 are arranged. A back surface of the liquid crystal panel fixing tape 30 is pasted on a peripheral edge section of the optical sheet 24 of the backlight unit 20 and the LED substrate 27, and a front surface thereof is pasted on peripheral edge sections of the rear polarizing plate 13, the thermal conducting sheet 40, which will be described later, and the TFT substrate 11. Accordingly, as illustrated in FIG. 1 and other drawings, the back surface of the rear polarizing plate 13 and the front surface of the optical sheet 24 are opposite each other while having a clearance therebetween corresponding to a thickness of the liquid crystal panel fixing tape 30, and the thermal conducting sheet 40 and the TFT substrate 11 are fixed to the LED substrate 27. Properties and materials of the liquid crystal panel fixing tape 30 will be described later.

[Thermal Conducting Mechanism]

Next, in the liquid crystal display device 1 according to the first embodiment, a mechanism for efficiently diffusing heat generated by the LEDs 26 and the IC driver 15, which are the generating components, and transferring the heat to the liquid crystal layer 16 will be described.

As a component related to such a mechanism, the liquid crystal display device 1 according to the first embodiment includes the thermal conducting sheet 40 and the liquid crystal panel fixing tape 30, which are described before.

For example, heat from the LEDs 26 is transferred from the LED substrate 27 to the thermal conducting sheet 40 via the liquid crystal panel fixing tape 30 and diffused in a planar direction over an entire region of the display area, and further transferred through the TFT substrate 11 to the liquid crystal layer 16. The heat from the IC driver 15 is transferred in a thickness direction within the TFT substrate 11 and to the thermal conducting sheet 40 and diffused in a planar direction over an entire region of the display area, and further transferred within the TFT substrate 11 to the liquid crystal layer 16.

The thermal conducting sheet 40 according to the present technology is a sheet having good thermal conducting properties and transparency. Specifically, the thermal conductivity is preferably 0.5 W/m·k or more, more preferably 1 W/m·k or more, and much more preferably 5 W/m k or more. If the thermal conductivity is within such a range, the heat transferred to a part of the sheet can be dispersedly transferred to other parts efficiently. Transmittance with respect to the light having a wavelength of 380 nm is preferably 60% or higher, more preferably 80% or higher, much more preferably 90% or higher. If the transmittance is within such a range, screen brightness is less likely to be decreased in a configuration that the sheet overlaps the display area of the liquid crystal panel 10. Furthermore, the thermal conducting sheet 40 preferably has a good heat resistance property and a good light resistance property in view of causing less deterioration and preferably has a good adhesive property if it is to be pasted on the TFT substrate 11 as will be described later.

The thermal conducting sheet 40 may be formed by mixing transparent fillers having good thermal conductivity and transparency with transparent resin and molding the mixture into a sheet. Or such sheets may be stacked in layers. Examples of the transparent resin include polycarbonate resin, epoxy resin, silicon resin, and mixtures thereof. Examples of the transparent fillers include insulating substances such as aluminum nitride, boron nitride, beryllium oxide, aluminum oxide, magnesium oxide, and silicon nitride. The transparent fillers may be in various forms such as a fiber or particles. In view of increasing the thermal conductivity in the planar direction of the thermal conducting sheet 40, it is preferable to align the transparent fillers formed in a fiber along the planar direction of the thermal conducting sheet 40. The transparent filler having an appropriate size is selected preferably according to the thickness of the thermal conducting sheet 40 while considering a balance of the thermal conductivity and a sheet forming property. For example, a size of the transparent filler may be preferably 0.1 μm or greater and 10 μm or smaller, more preferably 0.1 μm or greater and 1 μm or smaller, and much more preferably 0.1 μm or greater and 0.3 μm or smaller.

A double-sided adhesive tape having good thermal conductivity is used as the liquid crystal panel fixing tape 30 according to the present technology. A transparent sheet similar to the thermal conducting sheet 40 including transparent adhesive layers on both surfaces thereof may be used as the liquid crystal panel fixing tape 30. Or the liquid crystal fixing tape 30 may not be transparent because it is disposed to overlap only the common substrate non-overlapping region 11N of the TFT substrate 11, which is the non-display area. For example, light transmittance of the liquid crystal panel fixing tape 30 with respect to the light having the wavelength of 555 nm is preferably 1% or less, more preferably 0.1% or less, and much more preferably 0.01% or less. If the light transmittance is within such a range, the light blocking effect is exerted and light leaking is less likely to be caused near a peripheral edge section of the display area of the liquid crystal panel 10 and screen contrast is preferably increased. The thermal conductivity is preferably 300 W/m·k or more, more preferably 500 W/m k or more, and much more preferably 1000 W/m·k or more. The liquid crystal panel fixing tape 30 that does not require transparency can have high thermal conductivity as described before. If the thermal conductivity is within such a range, the heat transferred to a part of the tape can be dispersedly transferred to other parts quite efficiently.

The liquid crystal panel fixing tape 30 that is opaque may be made by forming a sheet from metal such as copper and aluminum or carbon material such as graphite and providing adhesive layers on both surfaces of the sheet. In view of the thermal conductivity, it is preferable to use graphite and a graphite sheet on the market can be used. Or opaque fillers that have high thermal conductivity and is opaque are mixed with polycarbonate resin, epoxy resin, silicon resin or a mixture thereof and the obtained mixture may be molded in a sheet and such a sheet may be used. Sheets that are obtained as above may be stacked in layers. Carbon material such as graphite may be preferably used as material of the opaque fillers.

As described before, the liquid crystal panel fixing tape 30 extends in the X-direction over the entire length of the short side of the liquid crystal panel 10 where the LEDs 26 are arranged. The liquid crystal panel fixing tape 30 is pasted so as to extend from the optical sheet 24 to the front surface of the LED substrate 27 and also pasted on the rear polarizing plate 13, the thermal conducting sheet 40, and the TFT substrate 11. The thermal conducting sheet 40 is directly in contact with the back surface of the TFT substrate 11 and covers the entire region of the display area and extends to and overlaps a part of the common substrate non-overlapping region 11N. The thermal conducting sheet 40 may be pasted on the TFT substrate 11 with adhesive material or pressure sensitive adhesive material or may be fixed such that the thermal conducting sheet 40 is pressed by the rear polarizing plate 13 to the TFT substrate 11. In view of efficiently transferring the heat from the thermal conducting sheet 40 to the TFT substrate 11 and keeping quality of display images, the thermal conducting sheet 40 is preferably pasted on the TFT substrate 11 with adhesive material. As illustrated in FIG. 1, the thermal conducting sheet 40 extends such that the common substrate non-overlapping region 11N side section thereof overlaps the front side of the LEDs 26 and the LED substrate 27 and also overlaps the back surface side of the IC driver 15. A planar shape of the thermal conducting sheet 40 is not particularly limited but may be preferably determined as appropriate according to a size and a shape of the display area and arrangement of the LEDs 26.

Verifying experiments were performed to confirm relation of temperature and a response speed of the liquid crystals. In the experiments, positive liquid crystals having a phase-transition temperature of 85° C. were used as the liquid crystal material and the temperature was maintained constant in a thermostatic tank, and the response speed was measured by Si photo diode S9219 and a photosensor amplifier C9329 produced by Hamamatsu Photonics. The graph in FIG. 2 illustrates dependency of the response speed on temperature that is obtained in the measurement. The response speed is accelerated by 14% by increasing the temperature of the liquid crystal material from 25° C. to 30° C. and is accelerated by 24% by increasing the temperature to 35° C.

Operations and Effects of First Embodiment

As described before, the liquid crystal display device 1 according to the first embodiment includes configurations described in following [1] to [6].

The liquid crystal display device includes [1] the liquid crystal panel 10 displaying an image and the LED 26 and the IC driver 15 that are one heat generating component or multiple heat generating components that generates/generate heat during operation, and the liquid crystal panel 10 includes a pair of substrates 11, 12 that are disposed opposite each other, the liquid crystal layer 16 containing liquid crystal molecules and sealed between the pair of substrates 11, 12, and the transparent thermal conducting sheet 40. At least a part of the thermal conducting sheet 40 is continuous from the heat generating components 26, 15 and another part thereof is directly in contact with at least one TFT substrate 11 and the thermal conducting sheet 40 covers the display area.

According to the configuration of [1], at the edge section on the common substrate non-overlapping region 11N side, the thermal conducting sheet 40 is continuous indirectly from the LEDs 26 that are the heat generating components via the liquid crystal panel fixing tape 30 and the LED substrate 27 or continuous indirectly from the IC driver 15 that is the heat generating component via the TFT substrate 11. Other parts of the thermal conducting sheet 40 are directly in contact with the TFT substrate 11 such that the heat is transferred from the heat generating components 26, 15 to the liquid crystal layer 16 efficiently. Accordingly, the heat generated by the heat generating components 26, 15 can be effectively used to warm the liquid crystal layer 16 without being wasted and the response speed is less likely to be decreased under the low temperature environment. Since the thermal conducting sheet 40 is disposed to cover the display area of the TFT substrate 11, the heat can be diffused over a large area such that a local heatup of the liquid crystal display device 1 is less likely to occur. As a result, the liquid crystal display device 1 that achieved high definition and high response speed while saving energy can be obtained. The phrase of "at least a part of the thermal conducting sheet is continuous from the heat generating component" may include that the thermal conducting sheet is directly continuous from the heat generating component or the thermal conducting sheet is indirectly continuous from the heat generating component via another component.

In the first embodiment, since the thermal conducting sheet 40 extends to the vicinity of the LEDs 26 or the IC driver 15, the heat can be dispersedly transferred more efficiently.

[2] In the liquid crystal display device 1 of [1], the liquid crystal panel 10 further includes the polarizing plate 13, and the thermal conducting sheet 40 is disposed between the TFT substrate 11 and the polarizing plate 13.

According to the configuration of [2], the thermal conducting sheet 40 is disposed to be directly in contact with the substrate 11 much closer to the substrate 11 than the polarizing plate 13 is. Therefore, the heat can be transferred efficiently to the liquid crystal layer 16.

[3] The liquid crystal display device 1 of [1] or [2] further includes the backlight unit 20 including the LEDs (the light sources) 26 and supplying light to the liquid crystal panel 10, and at least one of the heat generating components is the LED 26 included in the backlight unit 20.

According to the configuration of [3], the heat generated by the LEDs 26 is transferred dispersedly by the thermal conducting sheet 40 to warm the entire liquid crystal layer 16 and the lowering of temperature is less likely to be caused. Accordingly, problems that may be caused by the local heatup of the liquid crystal display device 1 are less likely to be caused and the response speed is less likely to be reduced. Therefore, the number of light sources can be increased while keeping screen brightness and increasing definition.

[4] The liquid crystal display device 1 of [3] includes the liquid crystal panel fixing tape (the liquid crystal panel fixing member) 30 that fixes the liquid crystal panel 10 and the backlight unit 20 together, and the liquid crystal panel fixing tape 30 is formed from the thermal conducting member and is disposed to be directly in contact with the LED substrate (the light source substrate) 27 on which the LEDs 26 are mounted and the thermal conducting sheet 40.

According to the configuration of [4], the heat generated by the LEDs 26 is much more efficiently transferred from the LED substrate 27 to the thermal conducting sheet 40 via the liquid crystal panel fixing tape 30 and further from the TFT substrate 11 to the liquid crystal layer 16.

[5] The liquid crystal display device 1 of any one of [1] to [4] includes at least one of the heat generating components is disposed on the TFT substrate 11 and the thermal conducting sheet 40 extends to a position so as to overlap the position of the heat generating component in a plan view.

According to the configuration of [5], heat generated by the IC driver 15 that is one of the heat generating components and disposed on the TFT substrate 11 is easily transferred to the thermal conducting sheet 40 and further from the TFT substrate 11 to the liquid crystal layer 16.

Second Embodiment

A second embodiment will be described with reference to FIG. 3.

A liquid crystal display device 201 according to the second embodiment differs from the liquid crystal display device 1 according to the first embodiment in that a liquid crystal panel 210 does not include the rear polarizing plate and a thermal conducting sheet 240 functions as a polarizing plate. Hereinafter, configurations similar to those of the first embodiment are indicated by the same reference symbols and will not be described.

Figure 3:
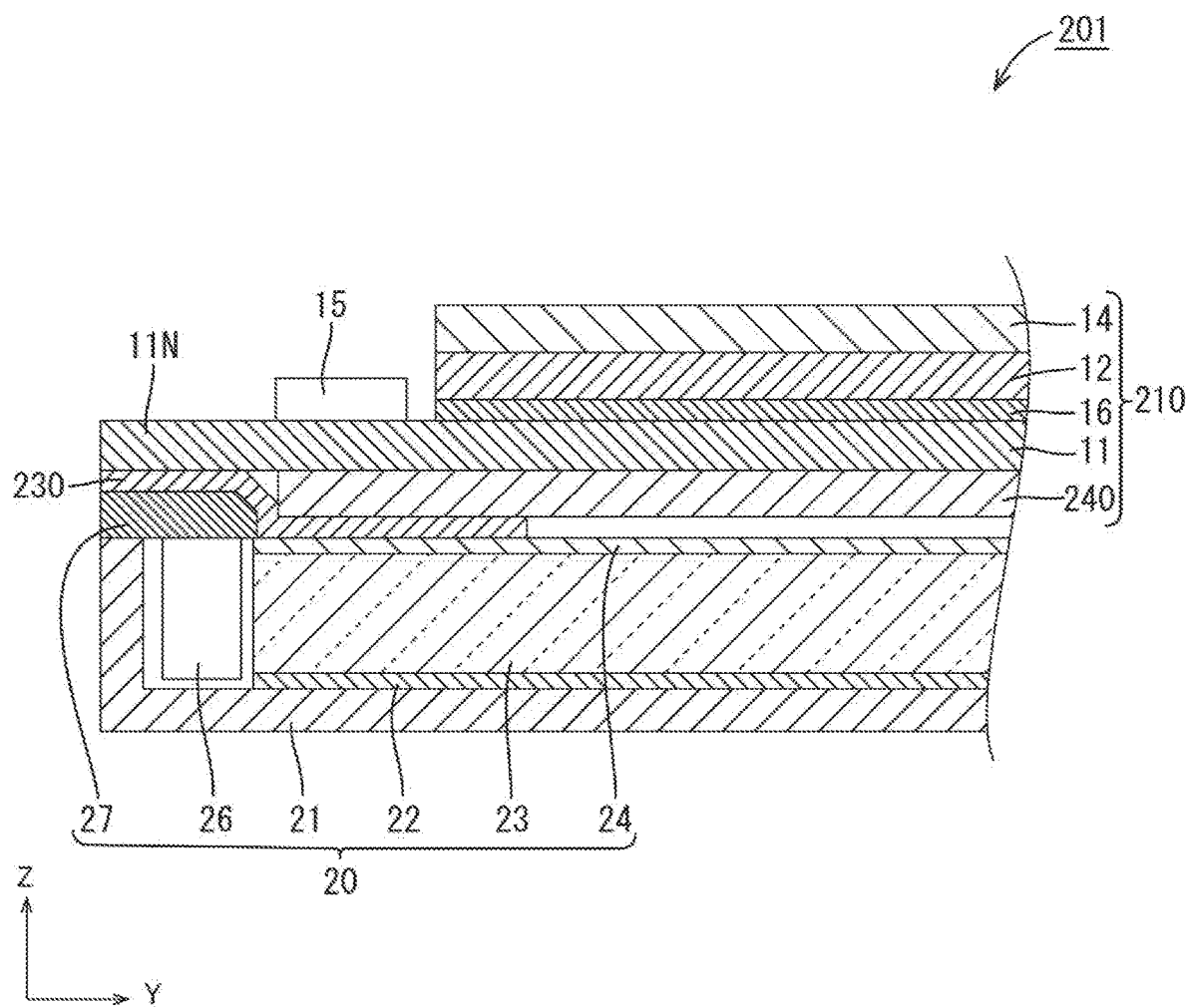
FIG. 3 is a cross-sectional schematic view schematically illustrating a configuration of a liquid crystal display device according to a second embodiment.

As illustrated in FIG. 3, the liquid crystal panel 210 of the second embodiment includes only the thermal conducting sheet 240 on a back side of the TFT substrate 11. The liquid crystal panel 210 does not include the rear polarizing plate and the thermal conducting sheet 240 also functions as a rear polarizing plate that selectively passes light that oscillate in a specific direction.

The thermal conducting sheet 240 has a long dimension in the longitudinal direction (the Y-axis direction) larger than that of the CF substrate 12 or the front polarizing plate 14 but slightly smaller than that of the TFT substrate 11. The thermal conducting sheet 240 is pasted with an upper short edge is aligned with the upper short edge of the TFT substrate 11 to cover the entire display area of the TFT substrate 11 and overlap the common substrate non-overlapping region 11N. As illustrated in FIG. 3, the section of the thermal conducting sheet 240 that is behind the common substrate non-overlapping region 11N overlaps the rear surface side of the IC driver 15 and extends to the vicinity of the LEDs 26 and the LED substrate 27. However, unlike the thermal conducting sheet 40 of the first embodiment, the thermal conducting sheet 240 does not extend to overlap the LED substrate 27 in a plan view. A rear surface of a liquid crystal panel fixing tape 230 is pasted on the optical sheet 24 and the LED substrate 27 of the backlight unit 20, and a front surface thereof is pasted on the thermal conducting sheet 240 and the TFT substrate 11.

Operations and Effects of Second Embodiment

As described before, the liquid crystal display device 201 according to the second embodiment includes a configuration described in following [6]. [6] The thermal conducting sheet 240 functions as the polarizing plate.

According to the configuration of [6], the thermal conducting sheet 240 and the rear polarizing plate are included integrally with each other as one component such that the liquid crystal display device 201 as a whole can be thinner than the liquid crystal display device 1. Suppose that the rear polarizing plate has the thermal conductivity, the configuration of the liquid crystal panel 210 is substantially same as that of the liquid crystal panel of a conventional configuration. Therefore, the liquid crystal panels can be produced similarly to those of the conventional configuration.

In the second embodiment, since the thermal conducting sheet 240 does not overlap the LED substrate 27, the liquid crystal display device 201 can be reduced in thickness.

Other Embodiments

The technology described herein is not limited to the embodiments described above and illustrated by the drawings. For example, the following embodiments will be included in the technical scope of the present technology.

(1) The heat generating components are not limited to the IC driver that drives the liquid crystal panel or the light sources but may be any other components as long as they generate heat during operation. The heat generated by the light source or the driver driving a touch panel may be used for warming the liquid crystals according to the present technology. A size or a shape of the thermal conducting tape or the thermal conducting sheet of the liquid crystal panel fixing tape may be altered as appropriate according to arrangement of the heat generating component.

(2) The substrate that is contacted with the thermal conducting sheet is not limited to the TFT substrate that is on the rear surface side of the liquid crystal panel. The thermal conducting sheet may be disposed to be contacted with the CF substrate that is disposed on the front side of the liquid crystal panel or two thermal conducting sheets may be disposed to be contacted with both of the TFT substrate and the CF substrate, respectively.

(3) The backlight unit including the light source is not limited to that of the edge light type. The present technology may be applied to a liquid crystal display device including a direct-type backlight unit. The light source is not limited to the LED but may be a fluorescent tube.

(4) A driving method or a mode of the liquid crystal display device is not particularly limited. The present technology may be applied to liquid crystal display devices that may be driven in any one of modes of the TN mode, the IPS mode, the FFS mode, and the VA mode.

The invention claimed is:

1. A liquid crystal display device comprising:
a liquid crystal panel displaying an image; and
one heat generating component or multiple heat generating components that generates/generate heat during operation, wherein
the liquid crystal panel includes
a pair of substrates that are disposed opposite each other, and
a liquid crystal layer containing liquid crystal molecules and being sealed between the pair of substrates, and
a transparent thermal conducing sheet is disposed such that a part thereof is continuous from the heat generating component and another part thereof is directly in contact with at least one of the pair of substrates to cover a display area.

2. The liquid crystal display device according to claim 1, wherein
the liquid crystal panel further includes a polarizing plate, and
the thermal conducting sheet is disposed between the one of the substrates and the polarizing plate.

3. The liquid crystal display device according to claim 1, wherein the thermal conducting sheet functions as a polarizing plate.

4. The liquid crystal display device according to claim 1, further comprising a backlight unit including a light source and supplying light to the liquid crystal panel, wherein
at least one of the heat generating components is the light source of the backlight unit.

5. The liquid crystal display device according to claim 4, further comprising a liquid crystal panel fixing member that fixes the liquid crystal panel and the backlight unit, the liquid crystal panel fixing member being formed from a thermal conducting material and disposed to be directly in contact with a light source substrate on which the light source is mounted and the thermal conducting sheet.

6. The liquid crystal display device according to claim 1, wherein at least one of the heat generating components is disposed on the one of the substrates, and the thermal conducting sheet extends to overlap an arrangement position of the heat generating component in a plan view.

7. The liquid crystal display device according to claim 1, wherein the thermal conducting sheet includes insulating substances.

8. The liquid crystal display device according to claim 1, wherein the thermal conducting sheet is formed by mixing transparent fillers with transparent resin.

9. The liquid crystal display device according to claim 6, wherein
the heat generating component is an IC driver that is configured to generate output signals that is output to the display area of the liquid crystal panel, and
the display area displays an image when the output signals are applied to the display area.

* * * * *